(12) United States Patent
    Chang et al.

(10) Patent No.: US 10,971,404 B2
(45) Date of Patent: Apr. 6, 2021

(54) SEMICONDUCTOR DEVICE

(71) Applicant: TAIWAN SEMICONDUCTOR MANUFACTURING COMPANY LTD., Hsinchu (TW)

(72) Inventors: Yu-Chi Chang, Kaohsiung (TW); Hsin-Li Cheng, Hsinchu County (TW); Felix Ying-Kit Tsui, Cupertino, CA (US)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 56 days.

(21) Appl. No.: 15/983,494

(22) Filed: May 18, 2018

(65) Prior Publication Data
    US 2018/0269110 A1    Sep. 20, 2018

Related U.S. Application Data

(62) Division of application No. 14/815,068, filed on Jul. 31, 2015, now Pat. No. 9,978,645.

(51) Int. Cl.
    *H01L 21/8234* (2006.01)
    *H01L 21/265* (2006.01)
    *H01L 29/66* (2006.01)
    *H01L 29/78* (2006.01)
    *H01L 29/10* (2006.01)
    *H01L 21/8238* (2006.01)

(52) U.S. Cl.
    CPC .. *H01L 21/823462* (2013.01); *H01L 21/2652* (2013.01); *H01L 21/823807* (2013.01); *H01L 21/823814* (2013.01); *H01L 29/105* (2013.01); *H01L 29/6653* (2013.01); *H01L 29/6659* (2013.01); *H01L 29/7833* (2013.01); *H01L 21/823842* (2013.01)

(58) Field of Classification Search
    CPC .................................................. H01L 21/8234
    See application file for complete search history.

(56) References Cited

U.S. PATENT DOCUMENTS

2016/0190280 A1* 6/2016 Young ............... H01L 29/4966
                                                         257/288
2016/0260611 A1* 9/2016 Consiglio ........... H01L 21/2254

* cited by examiner

*Primary Examiner* — Marvin Payen
(74) *Attorney, Agent, or Firm* — WPAT, P.C., Intellectual Property Attorneys; Anthony King

(57) ABSTRACT

A semiconductor device includes a semiconductor substrate, and a first transistor. The first transistor has a first gate on the semiconductor substrate, and a first lightly doped source/drain region within the semiconductor substrate to determine a first channel region beneath the first gate. A doping ratio determined as a concentration of the first lightly doped source/drain region divided by a concentration of the first channel region ranges from $1.0 \times 10^{13}$ to $1.0 \times 10^{17}$.

20 Claims, 22 Drawing Sheets

SEMICONDUCTOR DEVICE

CROSS REFERENCE TO RELATED APPLICATIONS

This application is a divisional of application Ser. No. 14/815,068, filed on Jul. 31, 2015, now allowed, which is incorporated by reference in its entirety.

BACKGROUND

Performance of a semiconductor integrated circuit may depend on manufacturing processes to manufacture semiconductor devices in the semiconductor integrated circuit. Two neighboring semiconductor devices manufactured by a same process are supposed to have the same characteristics and/or behave in a same manner. Because of manufacturing process variations, however, characteristics and behaviors of the two semiconductor devices may not be the same.

Generally, a semiconductor integrated circuit requires high circuit performance and high density. Therefore, in the case of a semiconductor device, e.g. a metal oxide semiconductor field effect transistor (or "MOSFET"), the technology for the forming a semiconductor integrated circuit has been scaled down to a sub-micron range as a result of the efforts to reduce the size of the MOSFET device. A lightly doped drain (or "LDD") structure is adopted in a MOSFET device to mitigate hot carriers injection (or "HCI") that adversely affects the reliability of the MOSFET device.

Random dopant fluctuation (or "RDF") resulting from the process of forming an LDD structure in a MOSFET device can alter the MOSFET device's properties, especially threshold voltage. Due to the variation of RDF, a mismatch between threshold voltages of the two transistors exists.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
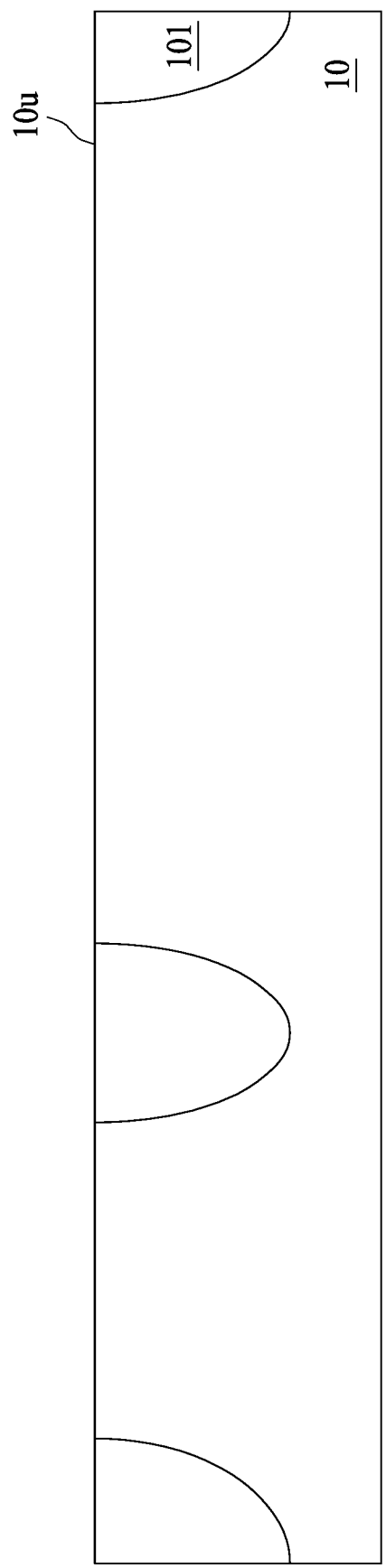
FIG. 1A, FIG. 1B, FIG. 1C, FIG. 1D, FIG. 1E, FIG. 1F, FIG. 1G, FIG. 1H, FIG. 1I, FIG. 1J, FIG. 1K, FIG. 1L and FIG. 1M illustrate a manufacturing method in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative tea s are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1A, FIG. 1B, FIG. 1C, FIG. 1D, FIG. 1E, FIG. 1F, FIG. 1G, FIG. 1H, FIG. 1I, FIG. 1J, FIG. 1K, FIG. 1L and FIG. 1M illustrate a manufacturing method in accordance with some embodiments.

Referring to FIG. 1A, a semiconductor substrate 10 is provided. The semiconductor substrate 10 may be but is not limited to, for example, a silicon substrate. A number of shallow trench isolation (STI) regions 101 are formed in the semiconductor substrate 10. The shallow trench isolation (STI) regions 101, which may be formed of suitable dielectric materials, may be provided to isolate transistor (not shown in FIG. 1A) electrically from neighboring semiconductor devices such as other transistors (not shown in FIG. 1A). The shallow trench isolation (STI) regions 101 may, for example, include an oxide (e.g., Ge oxide), an oxynitride (e.g., GaP oxynitride), silicon dioxide (SiO2), a nitrogen-bearing oxide (e.g., nitrogen-bearing $SiO_2$), a nitrogen-doped oxide (e.g., $N_2$-implanted $SiO_2$), silicon oxynitride ($Si_xO_yN_z$), and the like. The shallow trench isolation (STI) regions 101 may also be formed of any suitable "high dielectric constant" or "high K" material, where K is greater than or equal to about 8, such as titanium oxide ($Ti_xO_y$, e.g., $TiO_7$), tantalum oxide ($Ta_xO_y$, e.g., $Ta_2O_5$), barium strontium titanate (BST, $BaTiO_3/SrTiO_3$), and the like. Alternatively, the shallow trench isolation (STI) regions 101 may also be formed of any suitable "low dielectric constant" or "low K" dielectric material, where K is less than or equal to about 4.

Figure 1B:
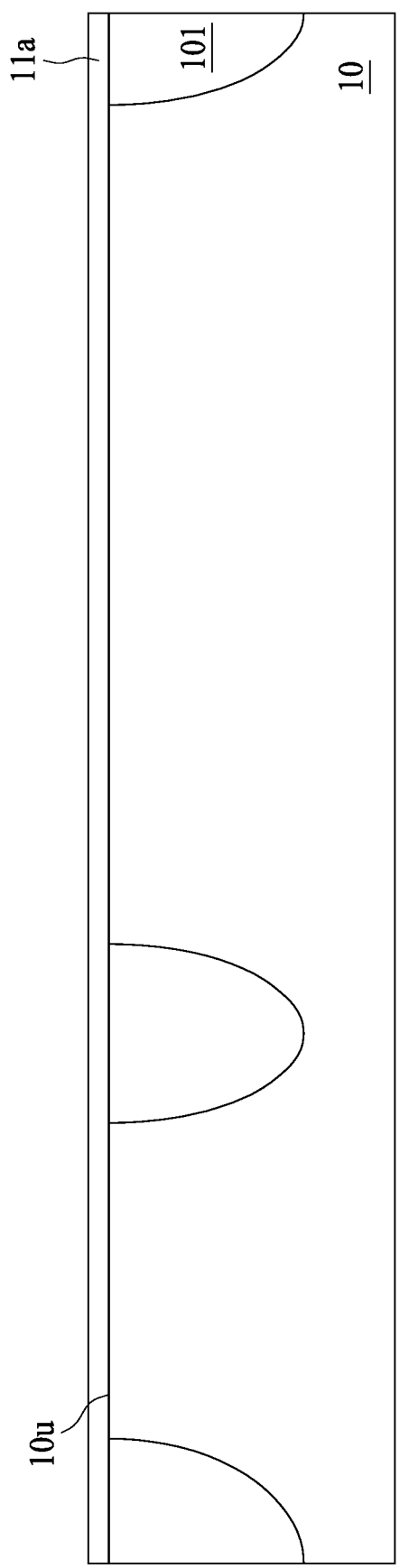

Referring to FIG. 1B, a dielectric layer 11a is formed on the semiconductor substrate 10. The dielectric layer 11a may be formed by a variety of known techniques for forming such layers, e.g., chemical vapor deposition (CND), low-pressure CVD (LPCVD), plasma-enhanced CVD (PECVD), sputtering and physical vapor deposition (PVD), thermal growing, and the like. The dielectric layer 11a may have a thickness above an upper surface 10u of the semiconductor substrate 10 ranging up to approximately 50 Å, for example, and may be formed from a variety of dielectric materials and may, for example, be an oxide (e.g., Ge oxide), an oxynitride (e.g., GaP oxynitride), silicon dioxide ($SiO_2$), a nitrogen-bearing oxide (e.g., nitrogen-bearing $SiO_2$), a nitrogen-doped oxide (e.g., $N_2$-implanted $SiO_2$), silicon oxynitride ($Si_xO_yN_z$), and the like.

The dielectric layer 11a may also be formed of any suitable "high dielectric constant" or "high K" material, where K is greater than or equal to about 8, such as titanium oxide ($Ti_xO_y$, $TiO_2$), tantalum oxide ($Ta_xI_y$, e.g., $Ta_2O_5$), barium strontium titanate (BST, $BaTiO_3$/$SrTiO_3$), and the like. The dielectric layer 11a may have an equivalent oxide thickness $t_{ox-eq}$ ranging up to approximately 50 Å, for example. An equivalent oxide thickness $t_{ox-eq}$ may be defined to be the thickness t of a dielectric material (with a dielectric constant K) that would have a capacitance per unit area C that is approximately the same as the capacitance per unit area $C_{ox}$ that a thickness $t_{ox-eq}$ of silicon dioxide ($SiO_2$) would have. Since $SiO_2$ has a dielectric constant $K_{ox}$ of approximately 4, and since $C=K/t$ and $C_{ox}=K_{ox}/t_{ox-eq}$, then $t=K/C=K/C_{ox}=Kt_{ox-eq}/K_{ox}=K_{tox-eq}/4$, approximately. For example, the dielectric layer 11a may be formed of a tantalum oxide ($Ta_xO_y$, e.g., $Ta_2O_5$) with a dielectric constant $K_{TaO}$ of approximately 24. Then, using $t=K_{TaO}/C=K_{TaO}/C_{ox}$ and $t=K_{TaO}t_{ox-eq}/K_{ox}=24t_{ox-eq}/4$, approximately, an equivalent oxide thickness $t_{ox-eq}$ ranging up to approximately 50 Å would correspond to a $Ta_2O_5$ thickness $t_{TaO}$ ranging up to approximately 300 Å.

Figure 1C:
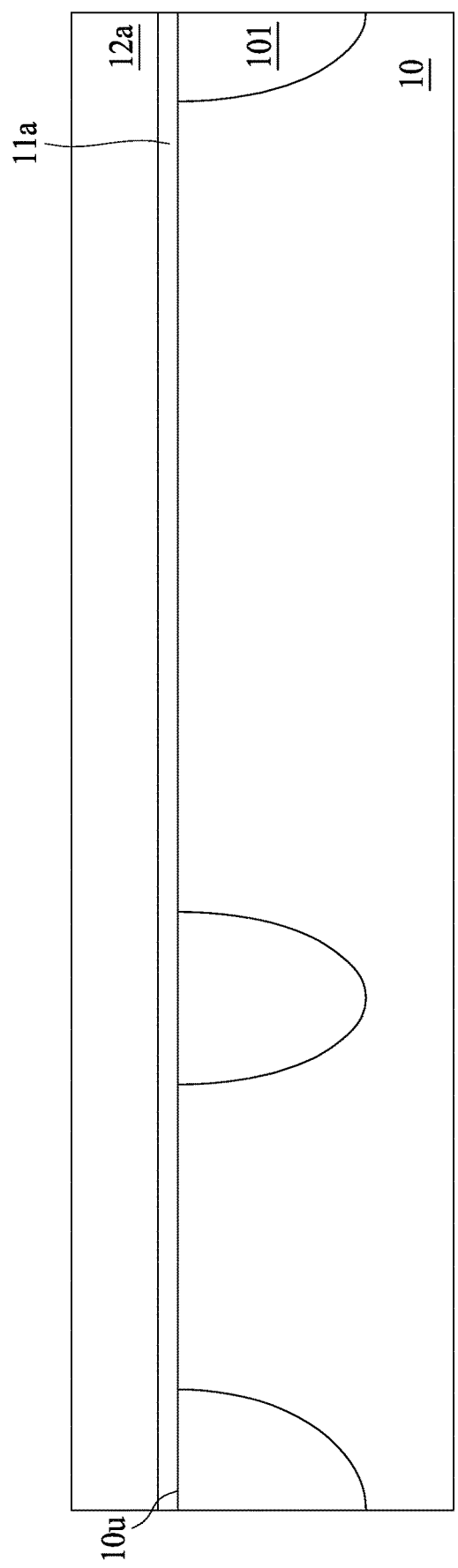

Referring to FIG. 1C, a conductive or semi-conductive layer 12a may be formed above the dielectric layer 11a. The layer 12a may be formed by a variety of known techniques, e.g., high-density ionized metal plasma (IMP) deposition, high-density inductively coupled plasma (ICP) deposition, sputtering, physical vapor deposition (PVD), chemical vapor deposition (CVD), low-pressure chemical vapor deposition (LPCVD), plasma-enhanced chemical vapor deposition (PECVD), and the like, and may have a thickness ranging from approximately 500-5000 Å.

The layer 12a may be a doped-poly conductive layer. The layer 12a may be formed by a variety of known techniques for forming such layers, e.g., chemical vapor deposition (CVD), low-pressure chemical vapor deposition (LPCVD), plasma-enhanced chemical vapor deposition (PECVD), physical vapor deposition (PVD), and the like, and may have a thickness ranging from approximately 500-5000 Å. In one illustrative embodiment, the layer 12a has a thickness of approximately 2000 Å and is formed by an LPCVD operation for higher throughput.

The layer 12a may be doped with arsenic (As) for an NMOS transistor, for example, or boron (B) for a PMOS transistor, to render the poly more conductive. The poly may be formed undoped, by an LPCVD process for higher throughput, to have a thickness ranging from approximately 1000-2000 Å, for example. The doping of the poly may conveniently be accomplished by diffusing or implanting the dopant atoms and/or molecules through the upper surface of the poly. The layer 12a may then be subjected to a heat-treating process that may be a rapid thermal anneal (RTA) operation performed at a temperature ranging from approximately 800-1100° C. for a time ranging from approximately 5-60 seconds.

In various alternative illustrative embodiments, the layer 11a may be formed of a variety of metals such as aluminum (Al), titanium (Ti), zirconium (Zr), tungsten (W), tantalum (Ta), nickel (Ni), molybdenum (Mo), cobalt (Co), and the like.

Figure 1D:
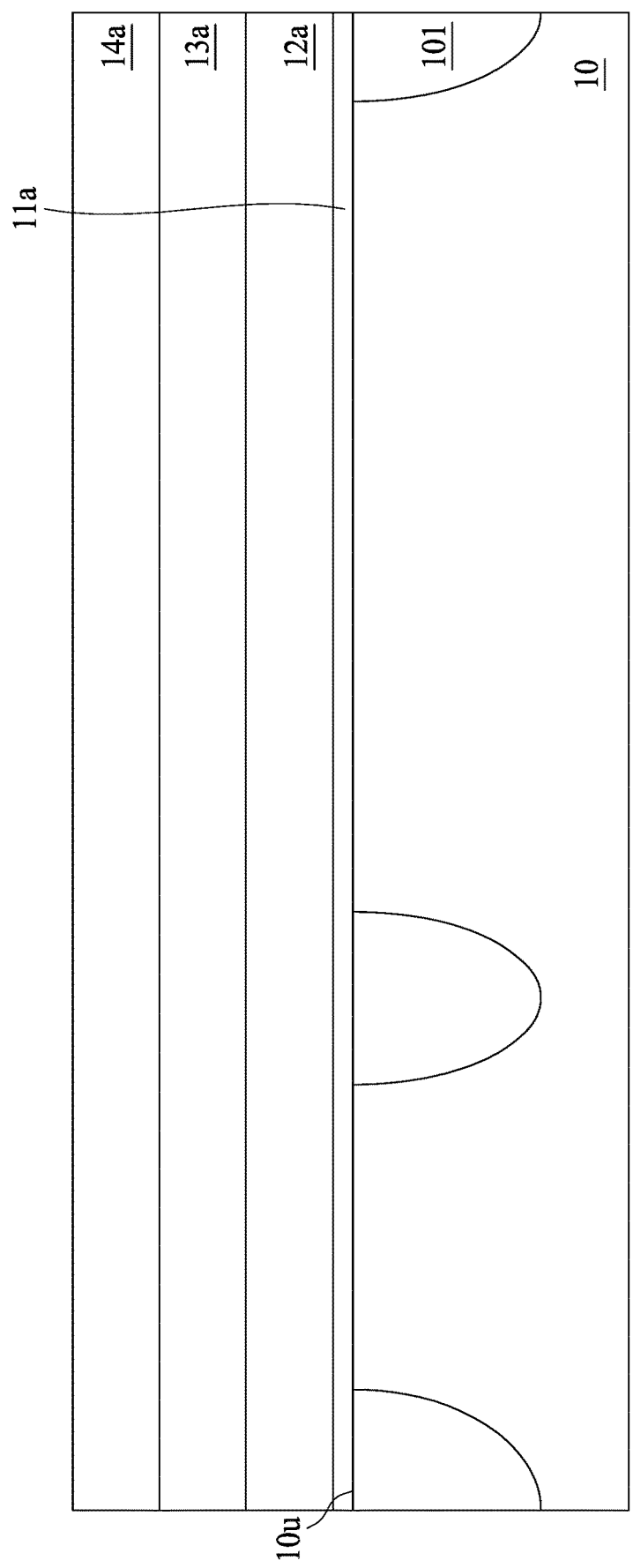

Referring to FIG. 1D, an inorganic bottom antireflective coating (BARC) layer 13a, such as SiON or $SiO_xN_y$ may be used in deep ultraviolet (DUV) photolithography, and may be formed above the conductive layer 12a. An upper surface of the inorganic bottom antireflective coating (BARC) layer 13a may be treated with an oxidizing treatment while being subjected to a rapid thermal anneal (RTA) operation performed at a temperature ranging from approximately 800-1100° C. for a time ranging from approximately 5-60 seconds.

In various illustrative embodiments, the oxidizing treatment may include flowing an oxidizing gas, such as oxygen ($O_2$), during the rapid thermal anneal (RTA) operation. It is believed that the oxidizing treatment neutralizes and/or passivates and/or passifies residual, free nitrogen ($N_2$) and residual nitrides, by forming nitrogen-containing compounds. These nitrogen-containing compounds, formed by the oxidizing treatment, are believed to be more stable than the residual, free nitrogen ($N_2$) and residual nitrides remaining on the upper surface of the inorganic bottom antireflective coating (BARC) layer 13a after formation of the inorganic bottom antireflective coating (BARC) layer 13a. These nitrogen-containing compounds, formed by the oxidizing treatment, are also believed not to cause "footing" or neutralization of the photo acid generator (PAG) in deep ultraviolet (DUV) photoresists at the interface between the inorganic bottom anti-reflective coating (BARC) layer 13a and an overlying photoresist layer 14a, such as deep ultraviolet (DUV) photoresist layer.

A photoresist layer 14a may be formed above the upper surface of the inorganic bottom antireflective coating (BARC) layer 13a. The photoresist layer 14a may have a smallest, diffraction-limited dimension δ that may be in a range of about 1800-2000 Å.

Figure 1E:
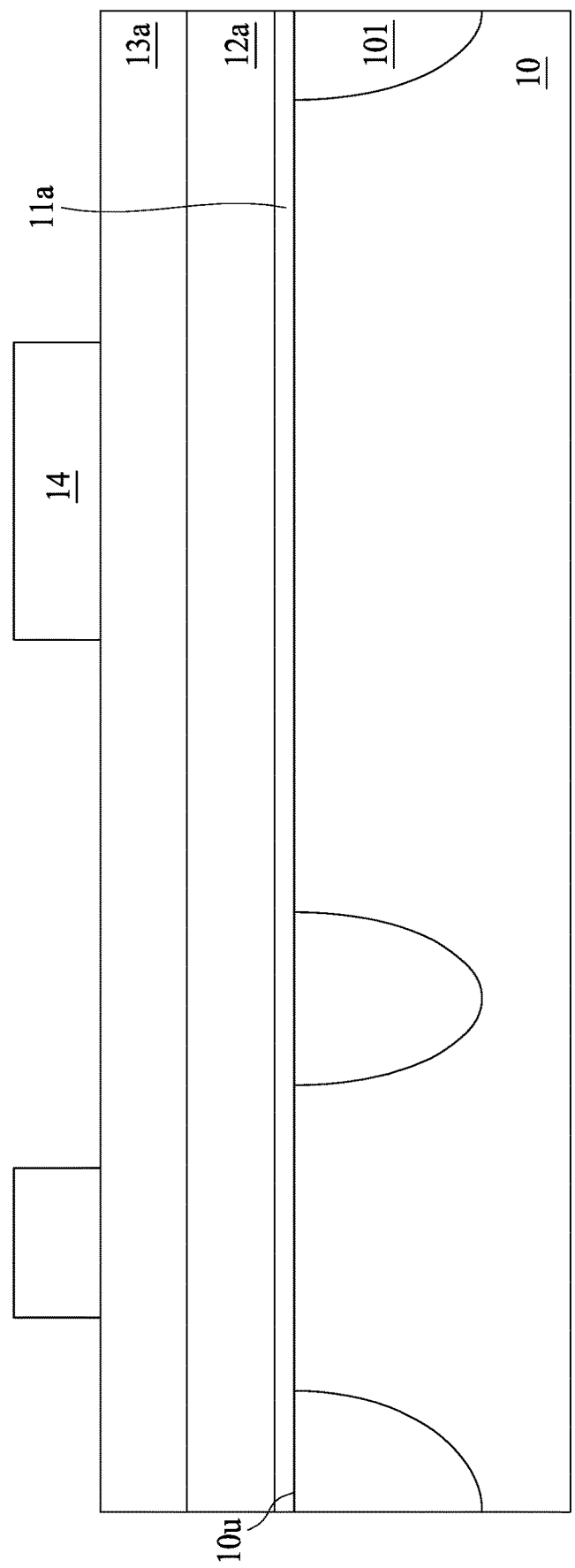

Referring to FIG. 1E, the photoresist layer 14a may be patterned using deep ultraviolet (DUV) photolithography to form a patterned photoresist layer 14.

Figure 1F:
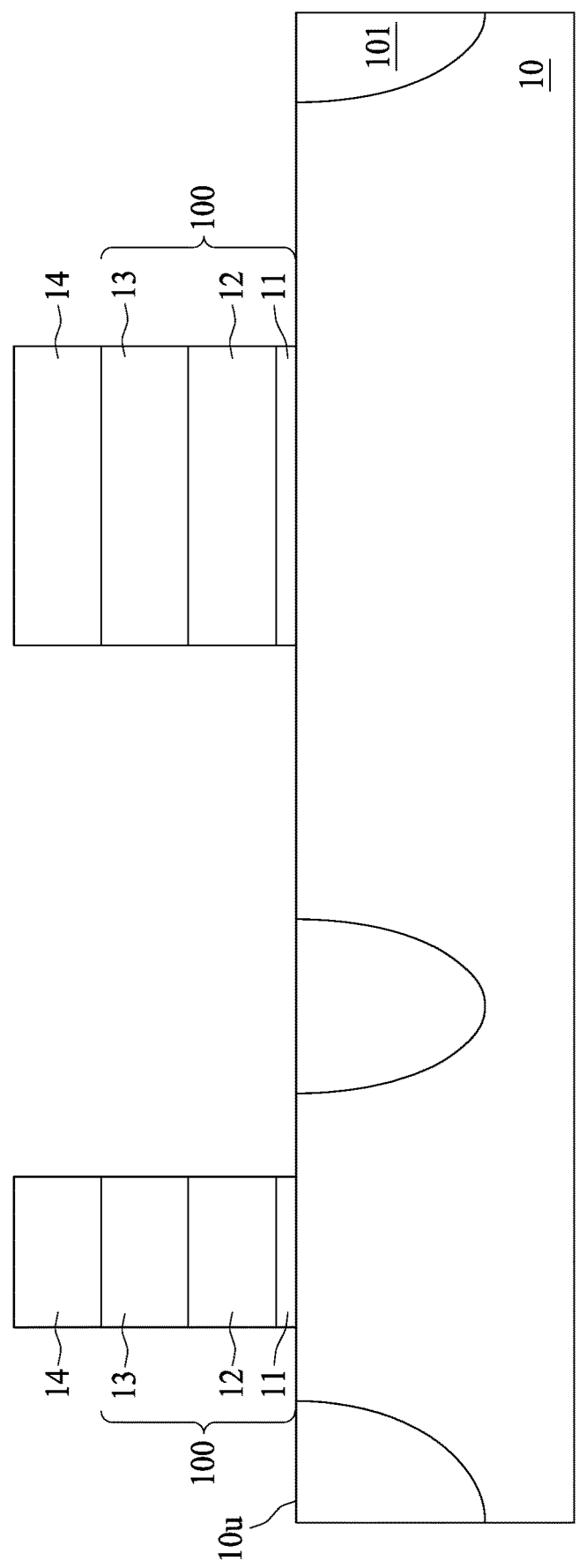

Referring to FIG. 1F, the patterned photoresist layer 14 is used as a mask to form a masked gate stack 100. The masked gate stack 100 may include the patterned photoresist layer 14, a patterned inorganic bottom antireflective coating (BARC) layer 13, a patterned gate conductor 12, and a patterned gate dielectric 11. The masked gate stack 100 may be formed by removing portions of the dielectric layer 11a, the layer 12a and the inorganic bottom antireflective coating (BARC) layer 13a not protected by the patterned photoresist layer 14, using an anisotropic etching technique, for example.

Figure 1G:
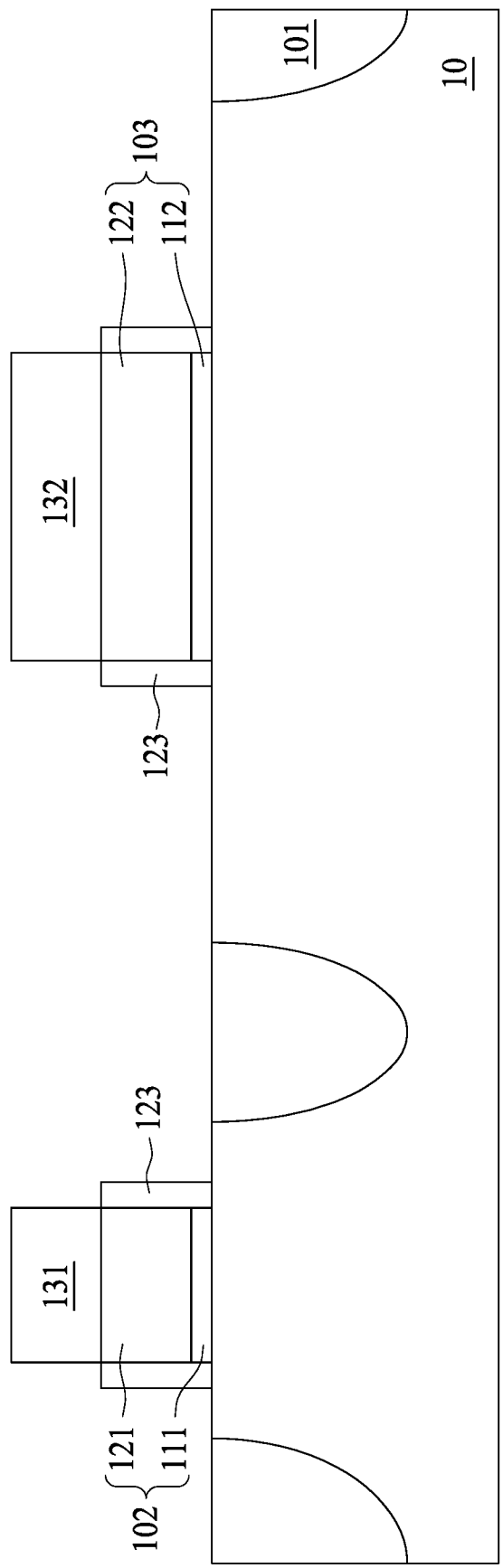

Referring to FIG. 1G, the patterned photoresist layer 14 is removed to form gate stacks 102 and 103 covered by filter layers 131 and 132. The patterned photoresist layer 14 may be removed by being stripped away, by ashing, for example. The stripping away of the patterned photoresist layer 14 forms an unmasked gate stacks 102 and 103. The gate stack 102 includes a gate dielectric 111, which is a part of the patterned gate dielectric 11, and a gate conductor 121, which is a part of the patterned gate conductor 12. The filter layer 131, which is a part of the patterned inorganic bottom antireflective coating (BARC) layer 13, covers the gate conductor 121 of the gate stack 102. The gate stack 103 includes a gate dielectric 112, which is a part of the patterned gate dielectric 11 other than the gate dielectric 111, and a gate conductor 122, which is a part of the patterned gate conductor 12 other than the gate conductor 121. The filter layer 132, which is a part of the patterned inorganic bottom antireflective coating (BARC) layer 13 other than the filter layer 131, covers the gate conductor 122 of the gate stack 103. The gate stack 102 neighbours the gate stack 103. The gate stack 102 and the gate stack 103 may be treated with an oxidizing treatment to form a gate oxide layer 123 surrounding or enclosing a lateral surface of each of the gate stack 102 and the gate stack 103. The gate oxide layer 123 may have a width of approximately 70 Å, for example, measured from the edges of each of the gate oxide layer 122.

Figure 1H:
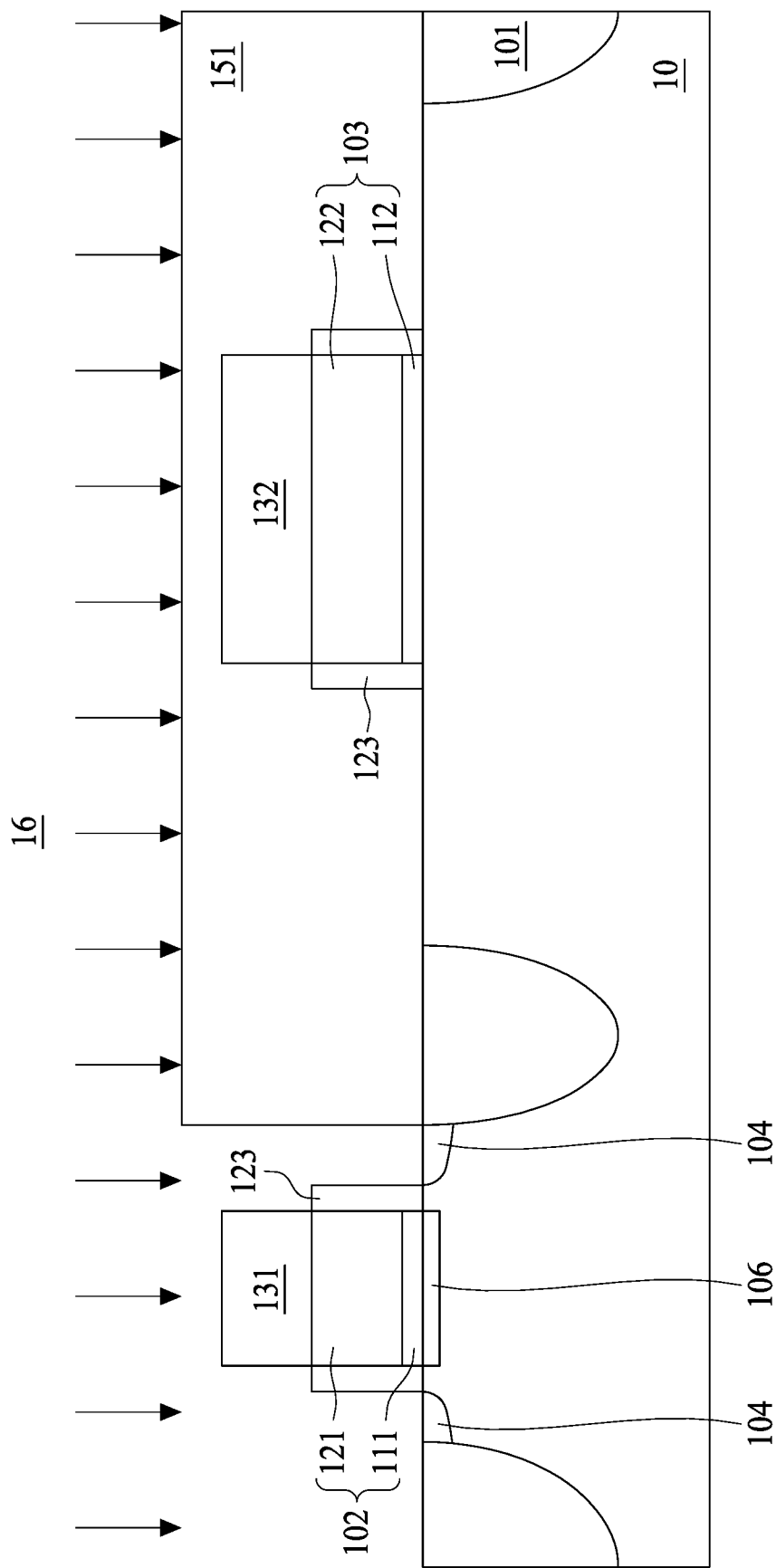

Referring to FIG. 1H, a patterned masking layer 151, formed of photoresist, for example, may be formed above the upper surface 10u of the semiconductor substrate 10, the filter layer 132, and the gate stack 103. The patterned masking layer 151 may be formed adjacent the gate stack 103. The patterned masking layer 151 may be formed by using a variety of known photolithography and/or etching techniques. The patterned masking layer 151 may have a thickness τ above the upper surface 10u of the semiconductor substrate 10 ranging from approximately 500-5000 Å, for example. In various illustrative embodiments, the thickness τ above the upper surface 10u of the semiconductor substrate 10 is about 5000 Å. In various alternative illustrative embodiments, the thickness τ above the upper surface 10u of the semiconductor substrate 10 ranges from approximately 500-1000 Å.

The patterned masking layer 151 may be formed to protect the PMOS (NMOS) transistor regions while the NMOS (PMOS) transistor regions are being implanted to form N⁻-doped (P⁻-doped) source/drain regions or lightly doped source/drain regions 104, for example. As shown in FIG. 1H, a dopant 16 (indicated by the arrows) may be implanted to introduce dopant atoms and/or molecules into the semiconductor substrate 10 to form the lightly doped source/drain regions 104. A doped region 106 is formed within the semiconductor substrate 10 beneath the gate stack 102 during implantation of the dopant 16. Concentration of the doped region 106 ranges from $4 \times 10^{14}$ to $2 \times 10^{15}$ particles/cm³. The majority of the dopant 16 may be filtered out by the filter layer 131. One to forty percent of dopant 16 may be filtered out by the filter layer 131.

In various illustrative embodiments, the lightly doped source/drain regions 104 may be formed by being implanted with a source/drain extension (SDE) dose of As (for N⁻-doping appropriate for an NMOS transistor) or BF2 (for P⁻-doping appropriate for a PMOS transistor). The source/drain extension (SDE) dose may range from about $1.0 \times 10^{14}$ to $1.0 \times 10^{15}$ ions/cm² at an implant energy ranging from about 3-50 keV. The lightly doped source/drain regions 104 may be subjected to a rapid thermal anneal (RTA) operation performed at a temperature ranging from approximately 800-1100° C. for a time ranging from approximately 5-60 seconds. The rapid thermal anneal (RTA) operation may activate the implant and form a more sharply defined and less graded activated implant junction with the semiconductor substrate 10 than would a rapid thermal anneal (RTA) operation following an implant with a source/drain extension (SDE) dose of more mobile P (for N⁻-doping appropriate for NMOS transistor) or B (for P⁻-doping appropriate for a PMOS transistor).

Figure 1I:
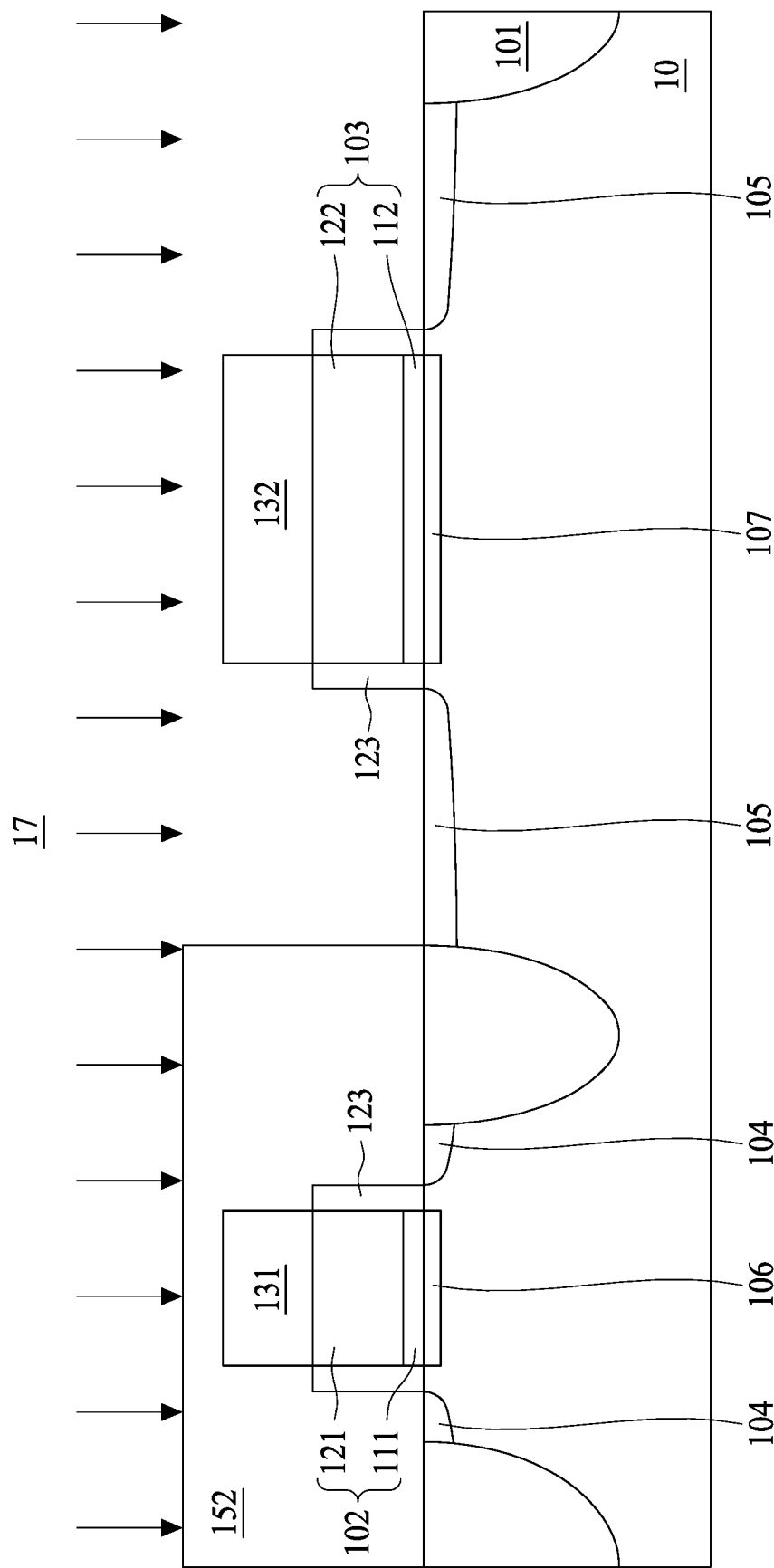

Referring to FIG. 1I, the patterned masking layer 151 is removed. A patterned masking layer 152, formed of photoresist, for example, may be formed above the upper surface 10u of the semiconductor substrate 10, the filter layer 131 the gate stack 102. The patterned masking layer 152 may be formed adjacent the gate stack 102. The patterned masking layer 152 may be formed by using a variety of known photolithography and/or etching techniques. The patterned masking layer 152 may have a thickness τ above the upper surface 10u of the semiconductor substrate 10 ranging from approximately 500-5000 Å, for example. In various illustrative embodiments, the thickness τ above the upper surface 10u of the semiconductor substrate 10 is about 5000 Å. In various alternative illustrative embodiments, the thickness τ above the upper surface 10u of the semiconductor substrate 10 ranges from approximately 500-1000 Å.

The patterned masking layer 152 may be formed to protect the PMOS (NMOS) transistor regions while the NMOS (PMOS) transistor regions are being implanted to form N⁻-doped (P⁻-doped) source/drain regions or lightly doped source/drain regions 105, for example. As shown in FIG. 1I, a dopant 17 (indicated by the arrows) may be implanted to introduce dopant atoms and/or molecules into the semiconductor substrate 10 to form the lightly doped source/drain regions 105. A doped region 107 is formed within the semiconductor substrate 10 beneath the gate stack 103 during implantation of the dopant 17. Concentration of the doped region 107 ranges from $4 \times 10^{14}$ to $2 \times 10^{15}$ particles/cm³. The majority of the dopant 17 may be filtered out by the filter layer 132. One to forty percent of dopant 17 may be filtered out by the filter layer 132.

In various illustrative embodiments, the lightly doped source/drain regions 105 may be formed by being implanted with a source/drain extension (SDE) dose of As (for N⁻-doping appropriate for an NMOS transistor) or BF2 (for P⁻-doping appropriate for a PMOS transistor). The source/drain extension (SDE) dose may range from about $1.0 \times 10^{14}$ to $1.0 \times 10^{15}$ ions/cm² at an implant energy ranging from about 3-50 keV. The lightly doped source/drain regions 105 may be subjected to a rapid thermal anneal (RTA) operation performed at a temperature ranging from approximately 800-1100° C. for a time ranging from approximately 5-60 seconds. The rapid thermal anneal (RTA) operation may activate the implant and form a more sharply defined and less graded activated implant junction with the substrate 10 than would a rapid thermal anneal (RTA) operation following an implant with a source/drain extension (SDE) dose of more mobile P (for N⁻-doping appropriate for an NMOS transistor) or B (for P⁻-doping appropriate for a PMOS transistor).

Figure 1J:
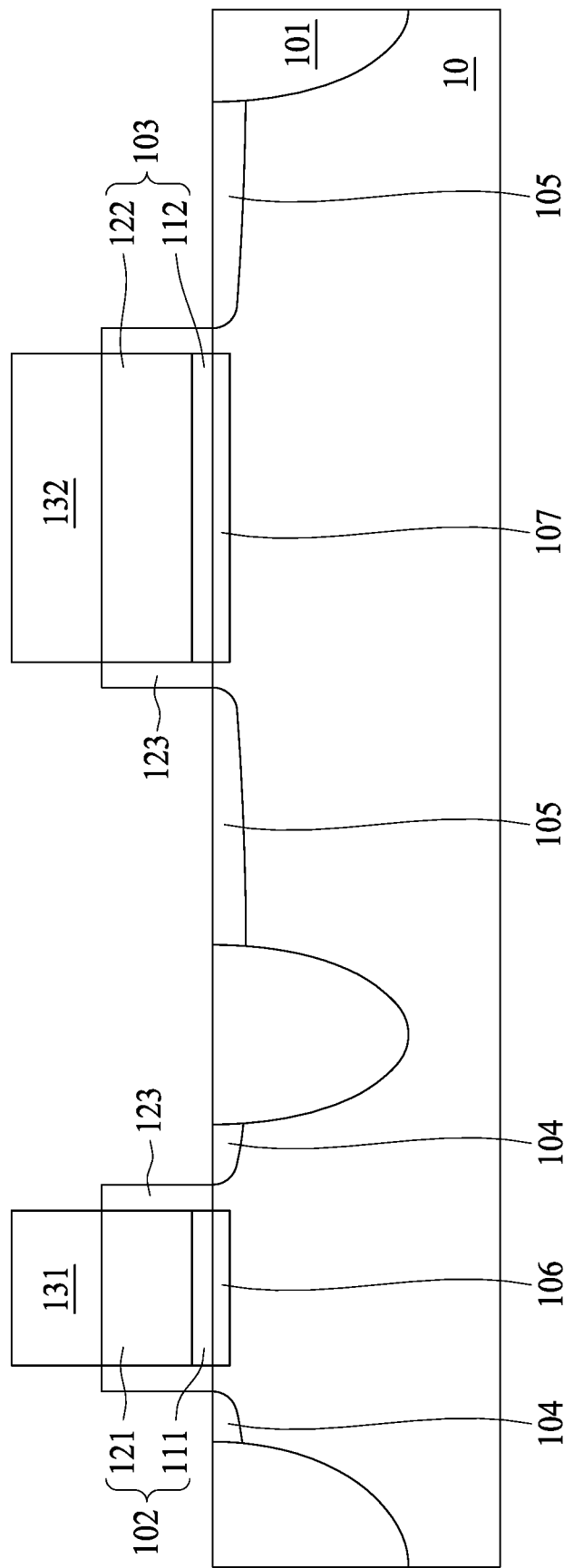

Referring to FIG. 1J, the patterned masking layer 152 is removed.

Figure 1K:
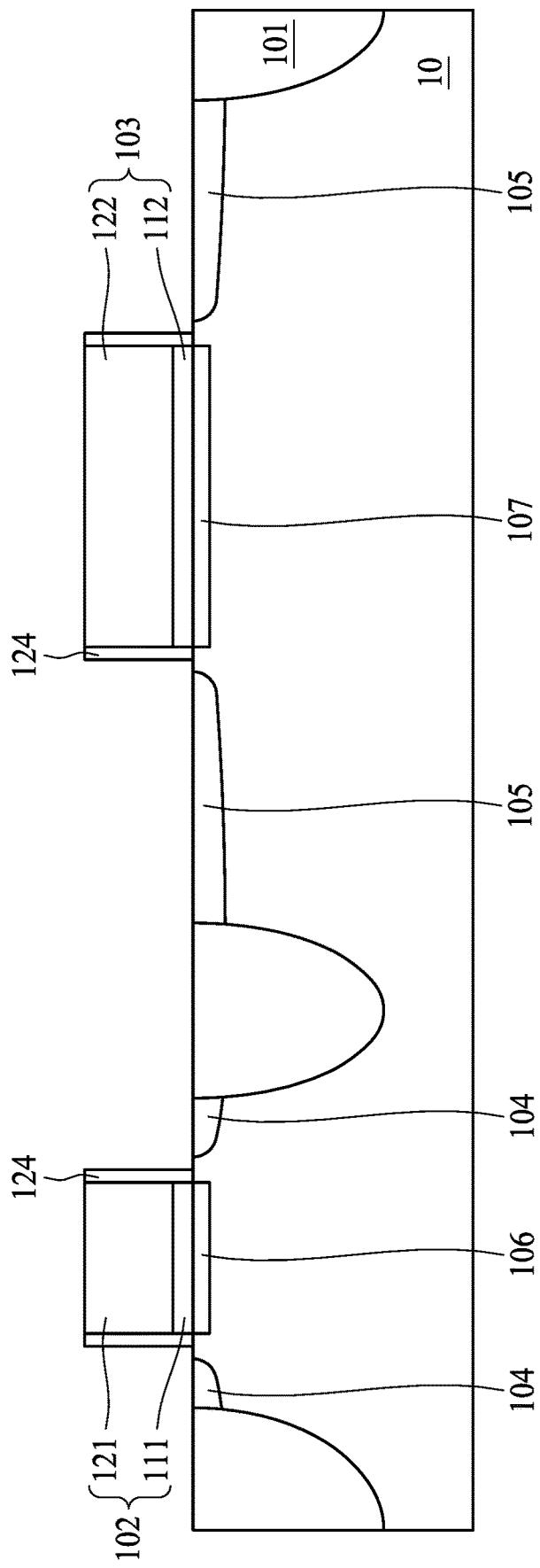

Referring to FIG. 1K, the filter layers 131 and 132 are removed. The filter layers 131 and 132 may be removed by etching technique. Etchant which is used to remove the filter layers 131 and 132 may also remove part of the gate oxide layer 123, e.g. the edge of the gate oxide layer 123, to form a trimmed gate oxide layer 124. The gate oxide layer 124 may have a width of approximately 40 Å, for example, measured from the edges of each of the gate oxide layer 124. Alternatively, the filter layers 131 and 132 may be stripped using hot phosphoric acid ($H_3PO_4$), for example.

Figure 1L:
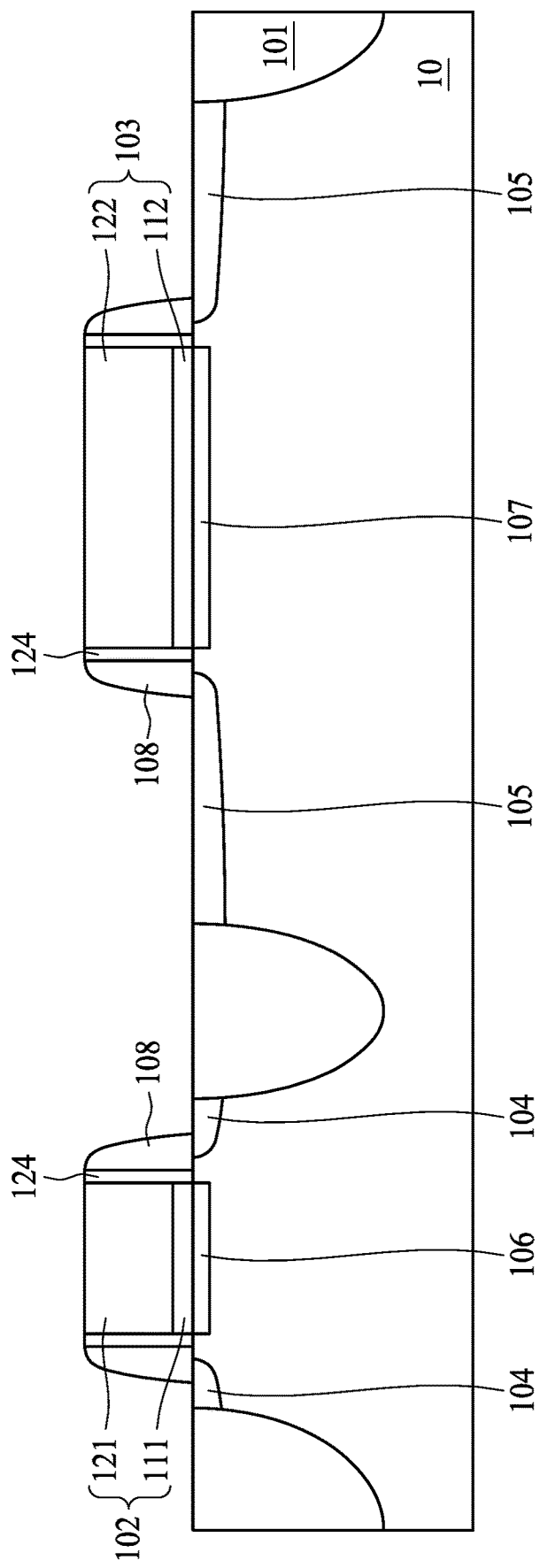

Referring to FIG. 1L, dielectric spacers 108 may be formed adjacent each of the gate stacks 102 and 103. The dielectric spacers 108 may be formed by a variety of techniques above the lightly doped source/drain regions 104 and 105 and adjacent the gate stacks 102 and 103. For example, the dielectric spacers 108 may be formed by depositing a conformal layer (not shown) of the appropriate material above and adjacent the gate stacks 102 and 103, and then performing an anisotropic reactive ion etching (RIE) process on the conformally blank deposited layer. The dielectric spacers 108 may each have a base thickness ranging from approximately 300-1500 Å, for example, measured from the edges of each of the gate stacks 102 and 103. In some embodiments, the gate oxide layer 124 may merge with the dielectric spacers 108 into a homogeneous layer and have base thickness ranging from approximately 340-1540 Å, for example, measured from the edges of each of the gate stacks 102 and 103.

The dielectric spacers 108 may be formed from a variety of dielectric materials and may, for example, be an oxide (e.g., Ge oxide), a nitride (e.g., GaAs nitride), an oxynitride (e.g., GaP oxynitride), silicon dioxide ($SiO_2$), nitrogen-bearing $SiO_2$, silicon nitride ($Si_3N_4$), silicon oxynitride ($Si_xO_yN_z$), and the like. The dielectric spacers 108 may also be formed of any suitable "low dielectric constant" or "low K" material, where K is less than or equal to about 4. Examples include Applied Material's Black Diamond®, Novellus' Coral®, Allied Signal's Nanoglass®, JSR's LKD5104, and the like. The dielectric spacers 108 may be comprised of a fluorine-doped oxide, a fluorine-doped nitride, a fluorine-doped oxynitride, a fluorine-doped low K material, and the like. In one illustrative embodiment, the dielectric spacers 108 are comprised of $SiO_2$, having a base thickness of approximately 1500 Å.

Figure 1M:
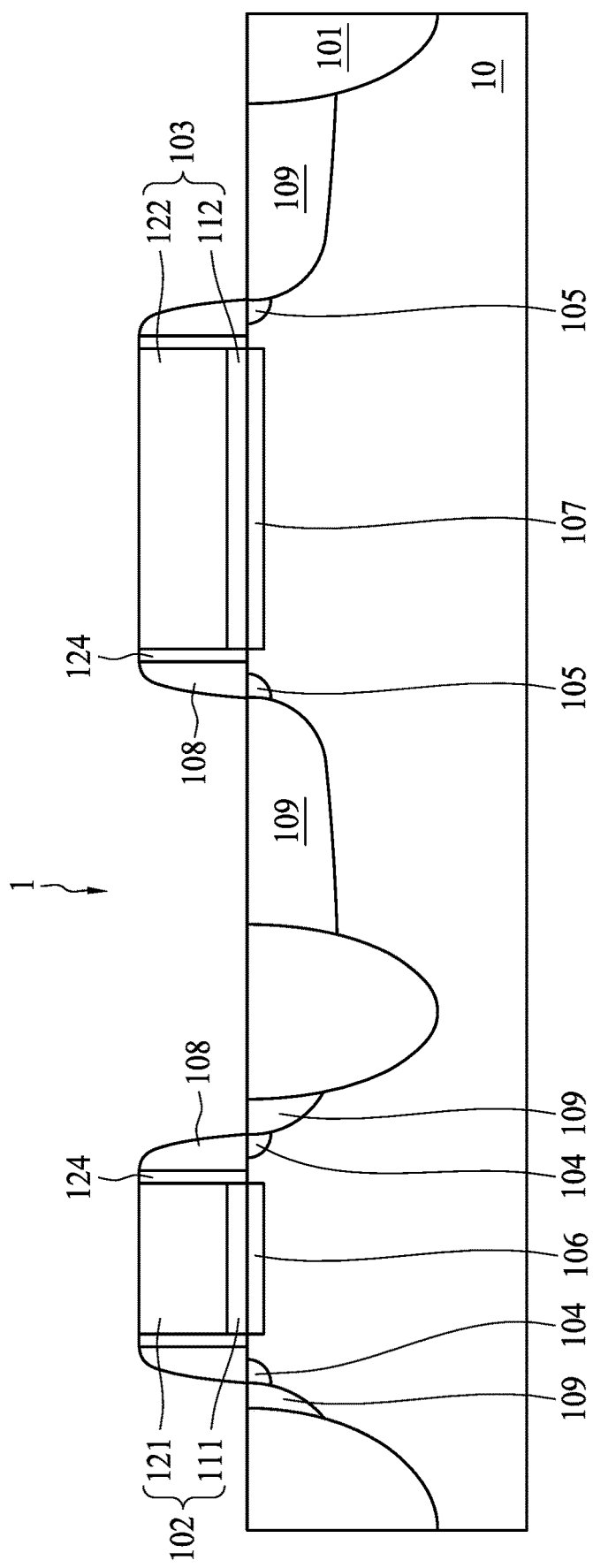

Referring to FIG. 1M, a dopant (not shown) may be implanted to introduce dopant atoms and/or molecules into the semiconductor substrate 10 to form $N^+$-doped ($P^+$-doped) regions 109. The $N^+$-doped ($P^+$-doped) regions 109 are formed in the semiconductor substrate 10 to form a semiconductor device 1. A dose of the dopant atoms and/or molecules may range from approximately $1.0 \times 10^{15}$-$5.0 \times 10^{15}$ ions/cm² of the appropriate dopant atoms and/or molecules, e.g., P for an illustrative NMOS transistor or B for an illustrative PMOS transistor. An implant energy of the dopant atoms and/or molecules may range from approximately 30-100 keV. In another illustrative embodiment, a dose of the dopant atoms is approximately $1.0 \times 10^{15}$ ions/cm² of P for an NMOS transistor or B for a PMOS transistor at an implant energy of approximately 30 keV. Channel regions are formed between the regions 109. A doping ratio determined as a concentration of the lightly doped source/drain regions 104 divided by a concentration of the channel region 106 ranges from $1.0 \times 10^{13}$ to $1.0 \times 10^{17}$. A doping ratio determined as a concentration of the lightly doped source/drain regions 105 divided by a concentration of the channel region 107 ranges from $1.0 \times 10^{13}$ to $1.0 \times 10^{17}$.

Figure 2:
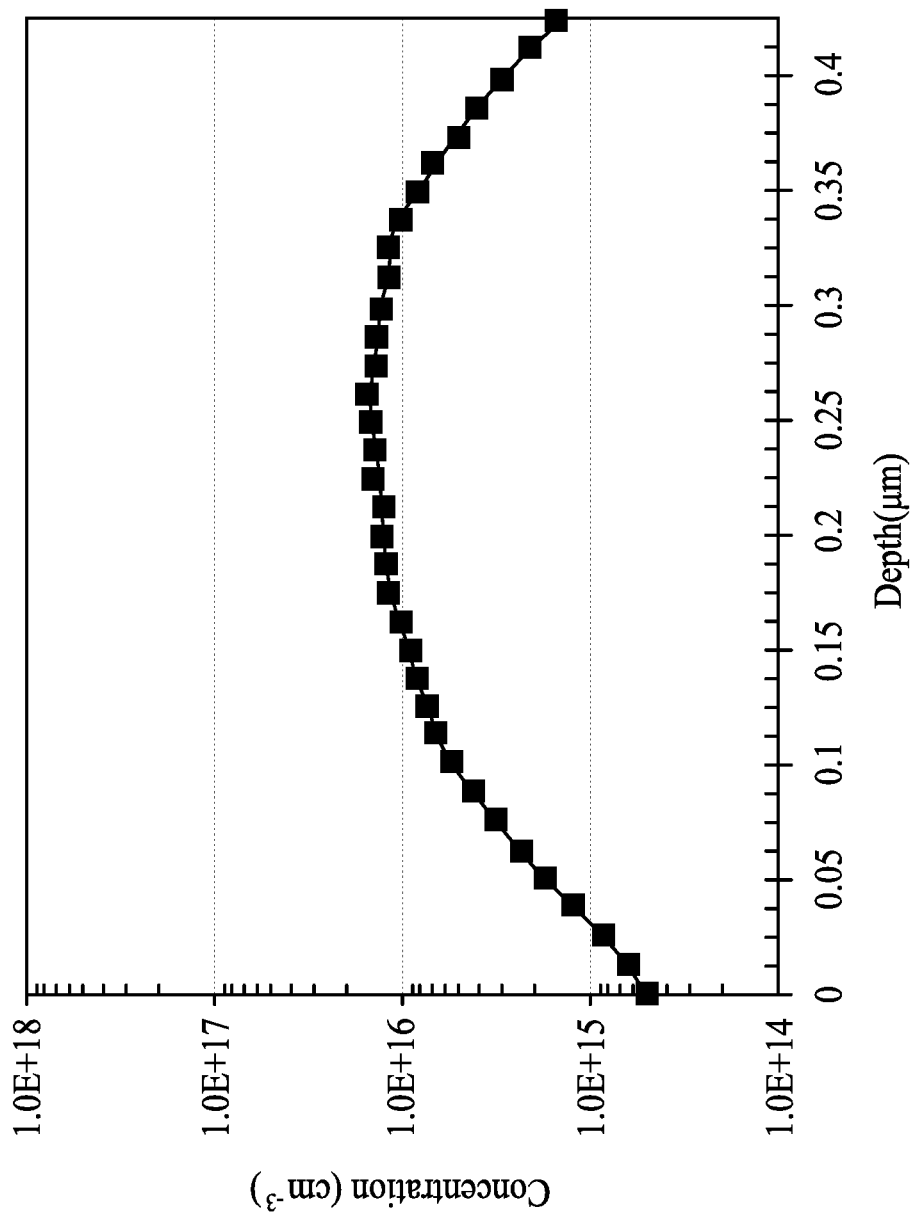
FIG. 2 is a graph illustrating a relationship between a doping concentration and a diffusion depth in a semiconductor substrate in accordance with some embodiments.

FIG. 2 is a graph illustrating a relationship between a doping concentration and a diffusion depth in a semiconductor substrate in accordance with some embodiments.

Referring to FIG. 2, concentration of at least one of the doped regions 106 and 107 of the semiconductor device 2 as illustrated and described with reference to FIG. 1M may range from $4 \times 10^{14}$ to $2 \times 10^{15}$ particles/cm². For example, the doped region 106 or the doped region 107 of the semiconductor device 1 may have a concentration of approximately $2 \times 10^{15}$ particles/cm³ in the depth of approximately 0.075 μm beneath the upper surface 10u of the semiconductor substrate 10. For example, the doped region 106 or the doped region 107 of the semiconductor device 1 may have a concentration of approximately $4 \times 10^{14}$ particles/cm³ beneath and near the upper surface 10u of the semiconductor substrate 10.

FIG. 3A, FIG. 3B, FIG. 3C, FIG. 3D, FIG. 3E, FIG. 3F and FIG. 3G illustrate a manufacturing method in accordance with some embodiments.

Figure 3A:
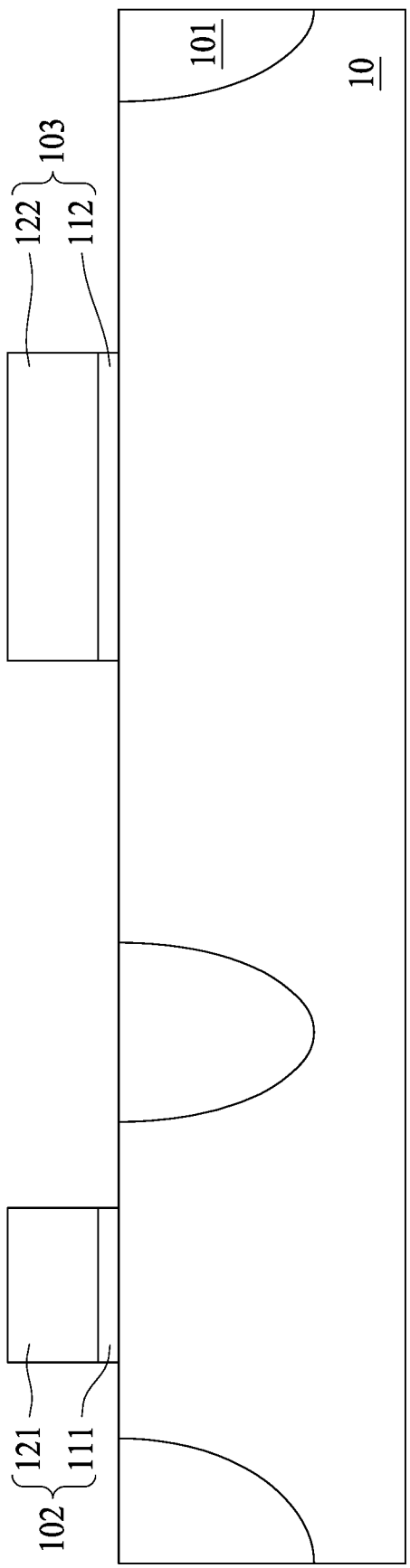
FIG. 3A, FIG. 3B FIG. 3C, FIG. 3D, FIG. 3E, FIG. 3F and FIG. 3G illustrate a manufacturing method in accordance with some embodiments.

Referring to FIG. 3A, subsequent to the operation as shown in FIG. 1F, the patterned inorganic bottom antireflective coating (BARC) layer 13 and the patterned photoresist layer 14 are removed to form gate stacks 102 and 103. The patterned inorganic bottom antireflective coating (BARC) layer 13 and the patterned photoresist layer 14 may be removed by being stripped away, by ashing, for example. Alternatively, the patterned inorganic bottom antireflective coating (BARC) layer 13 and the patterned photoresist layer 14, may be stripped using hot phosphoric acid ($H_3PO_4$), for example. The stripping away of the patterned inorganic bottom antireflective coating (BARC) layer 13 and the patterned photoresist layer 14 form an unmasked gate stacks 102 and 103. The gate stack 102 includes a gate dielectric 111, which is a part of the patterned gate dielectric 11, and a gate conductor 121, which is a part of the patterned gate conductor 12. The gate stack 103 includes a gate dielectric 112, which is a part of the patterned gate dielectric 11 other than the gate dielectric 111, and a gate conductor 122, which is a part of the patterned gate conductor 12 other than the gate conductor 121. The gate stack 102 neighbours the gate stack 103.

Figure 3B:
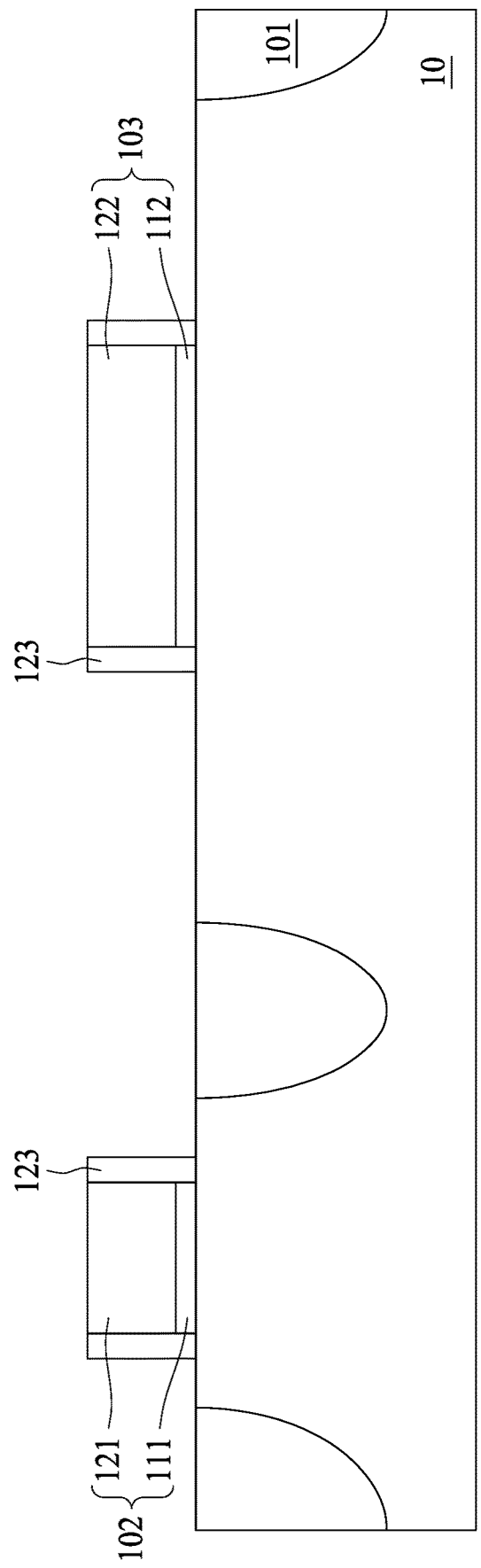

Referring to FIG. 3B, the gate stack 102 and the gate stack 103 may be treated with an oxidizing treatment to form a gate oxide layer 123 surrounding or enclosing a lateral surface of each of the gate stack 102 and the gate stack 103.

Figure 3C:
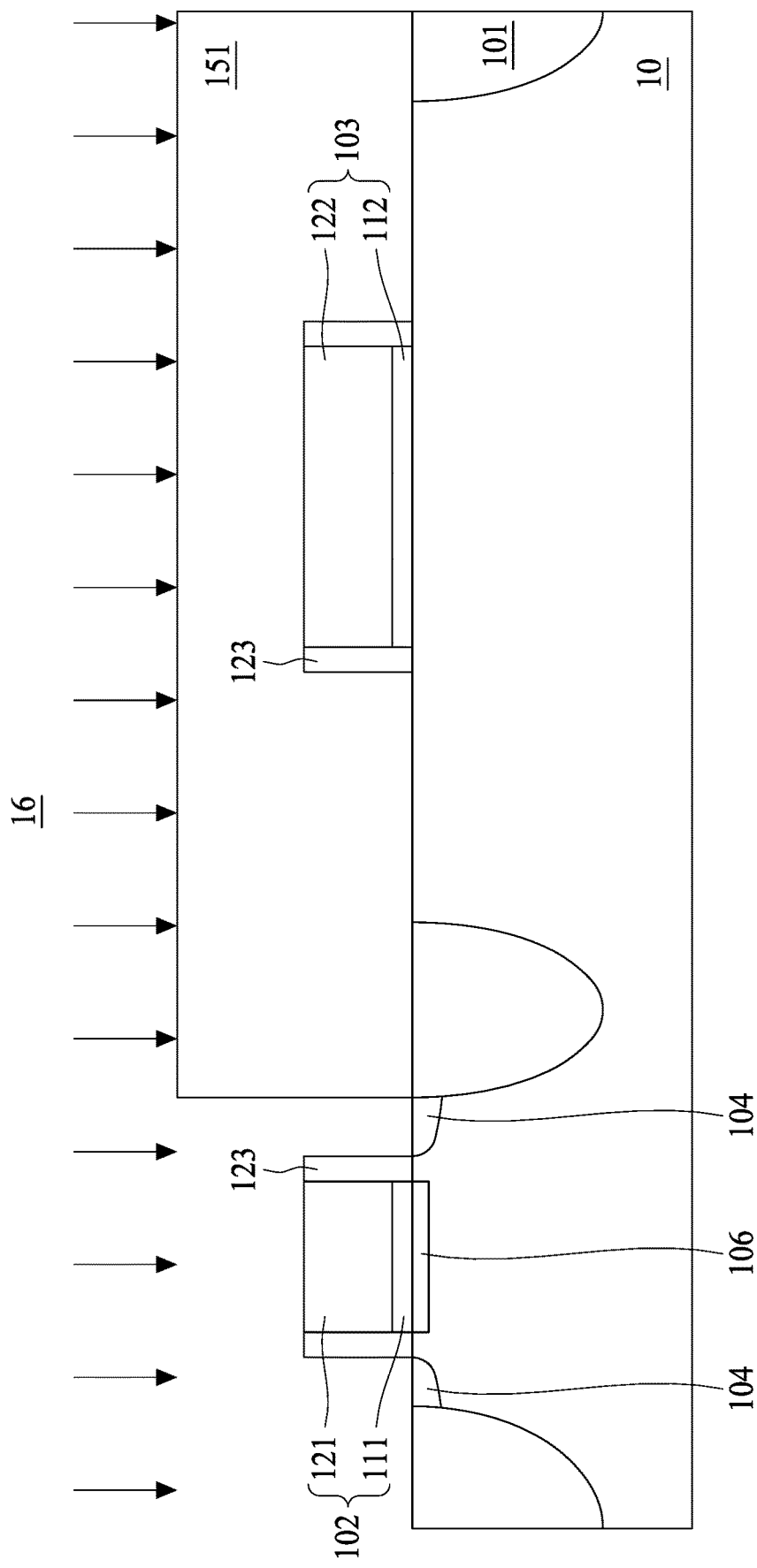

Referring to FIG. 3C, a patterned masking layer 151 formed of photoresist, for example, may be formed above the upper surface 10u of the semiconductor substrate 10 and the unmasked a stack 103. The patterned masking layer 151, may be formed adjacent the unmasked gate stack 103. The patterned masking layer 151 may be formed by using a variety of known photolithography and/or etching techniques. The patterned masking layer 151 may have a thickness τ above the upper surface 10u of the semiconductor substrate 10 ranging from approximately 500-5000 Å, for example. In various illustrative embodiments, the thickness τ above the upper surface 10u of the semiconductor substrate 10 is about 5000 Å. In various alternative illustrative embodiments, the thickness τ above the upper surface 10u of the semiconductor substrate 10 ranges from approximately 500-1000 Å.

The patterned masking layer 151 may be formed to protect the PMOS (NMOS) transistor regions while the NMOS (PMOS) transistor regions are being implanted to form lightly doped source/drain regions 104, for example. As shown in FIG. 3C, a dopant 16 (indicated by the avows) may be implanted to introduce dopant atoms and/or molecules into the semiconductor substrate 10 to form the lightly doped source/drain regions 104. A doped region 106 is formed within the semiconductor substrate 10 beneath the gate stack 102 during implantation of the dopant 16. Concentration of the doped region 106 ranges from $5 \times 10^{15}$ to $4 \times 10^{16}$ particles/cm³.

In various illustrative embodiments, the lightly doped source/drain regions 104 may be formed by being implanted with a source/drain extension (SDE) dose of As (for $N^-$-doping appropriate for an NMOS transistor) BF2 (for $P^-$-doping appropriate for a PMOS transistor). The source/drain extension (SDE) dose may range from about $1.0 \times 10^{14}$ to $1.0 \times 10^{15}$ ions/cm² at an implant energy ranging from about 3-50 keV. The lightly doped source/drain regions 104 may be subjected to a rapid thermal anneal (RTA) operation performed at a temperature ranging from approximately 800-1100° C. for a time ranging from approximately 5-60 seconds. The rapid thermal anneal (RTA) operation may activate the implant and form a more sharply defined and less graded activated implant junction with the substrate 10 than would a rapid thermal anneal (RTA) operation following an implant with a source/drain extension (SDE) dose of more mobile P (for $N^-$-doping appropriate for an NMOS transistor) or B (for $P^-$-doping appropriate for a PMOS transistor).

Figure 3D:
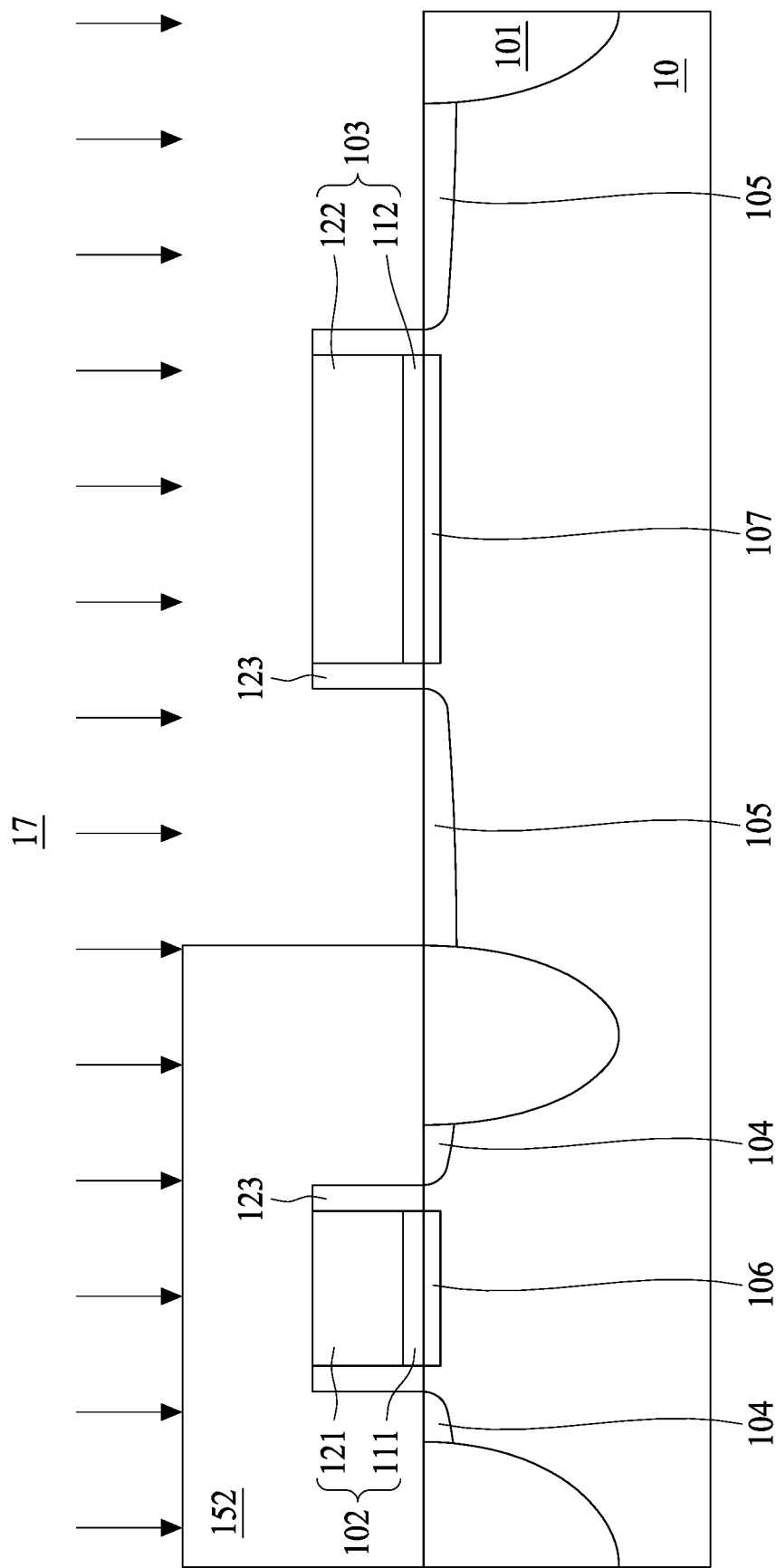

Referring to FIG. 3D, the patterned masking layer 151 is removed. A patterned masking layer 152, formed of photoresist, for example, may be formed above upper surface 10u of the semiconductor substrate 10 and the unmasked gate stack 102. The patterned masking layer 152, may be formed adjacent the unmasked gate stack 102. The patterned masking layer 152 may be formed by using a variety of known photolithography and/or etching techniques. The patterned masking layer 152 may have a thickness τ above the upper surface 10u of the semiconductor substrate 10 ranging from approximately 500-5000 Å for example. In various illustrative embodiments, the thickness τ above the upper surface $10u$ of the semiconductor substrate 10 is about 5000 Å. In various alternative illustrative embodiments, the thickness τ above the upper surface $10u$ of the semiconductor substrate 10 ranges from approximately 500-1000 Å.

The patterned masking lager 152 may be formed to protect the PMOS (NMOS) transistor regions while the NMOS (PMOS) transistor regions are being implanted to form lightly doped source/drain regions 105, for example. As shown in FIG. 3D, a dopant 17 (indicated by the arrows) may be implanted to introduce dopant atoms and/or molecules into the semiconductor substrate 10 to form the lightly doped source/drain regions 105. A doped region 107 is formed within the semiconductor substrate 10 beneath the gate stack 103 during implantation of the dopant 17. Concentration of the doped region 107 ranges from $5 \times 10^{15}$ to $4 \times 10^{16}$ particles/cm$^3$.

In various illustrative embodiments, the lightly doped source/drain regions 105 may be formed by being implanted with a source/drain extension (SDE) dose of As (for N$^-$-doping appropriate for an NMOS transistor) BF2 (for P$^-$-doping appropriate for a PMOS transistor). The source/drain extension SDE) dose may range from about $1.0 \times 10^{14}$ to $1.0 \times 10^{15}$ ions/cm$^2$ at an implant energy ranging from about 3-50 keV. The lightly doped source/drain regions 105 may be subjected to a rapid thermal anneal (RTA) operation performed at a temperature ranging from approximately 800-1100° C. for a time ranging from approximately 5-60 seconds. The rapid thermal anneal (RTA) operation may activate the implant and form a more sharply defined and less graded activated implant junction with the substrate 10 than would a rapid thermal anneal (RTA) operation following an implant with a source/drain extension (SDE) dose of more mobile P (for N$^-$-doping appropriate for an NMOS transistor) or B (for P$^-$-doping appropriate for a PMOS transistor).

Figure 3E:
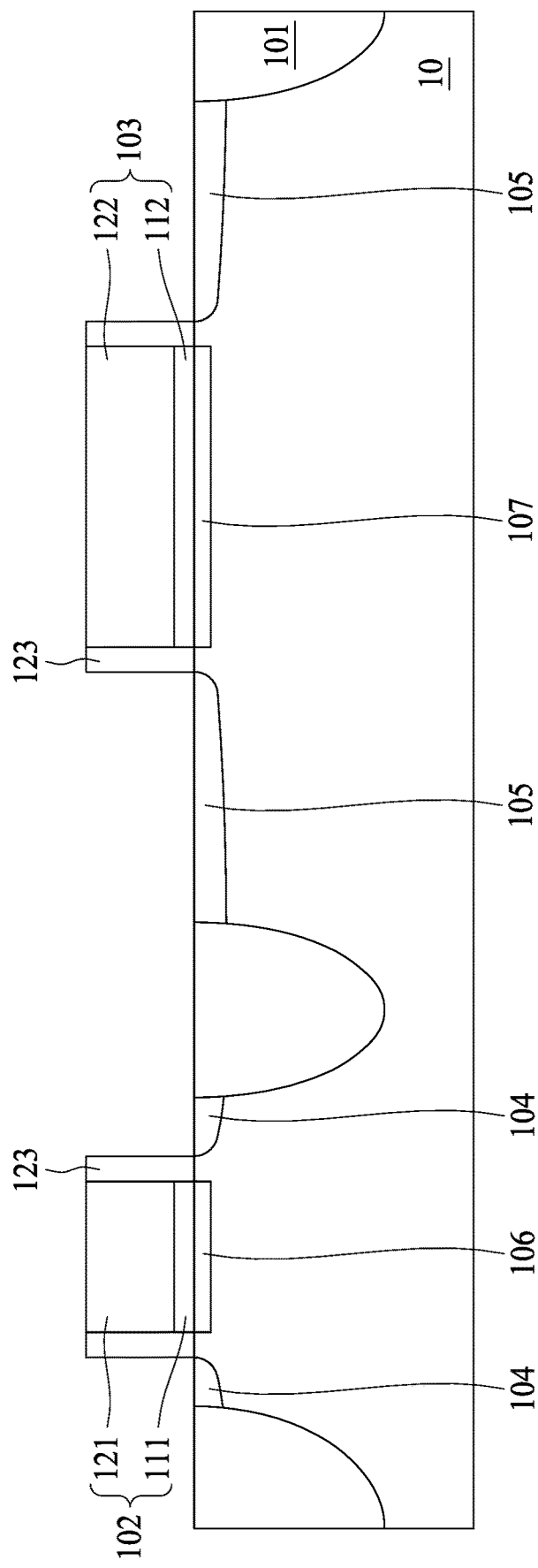

Referring to FIG. 3E, the patterned masking layer 152 is removed.

Figure 3F:
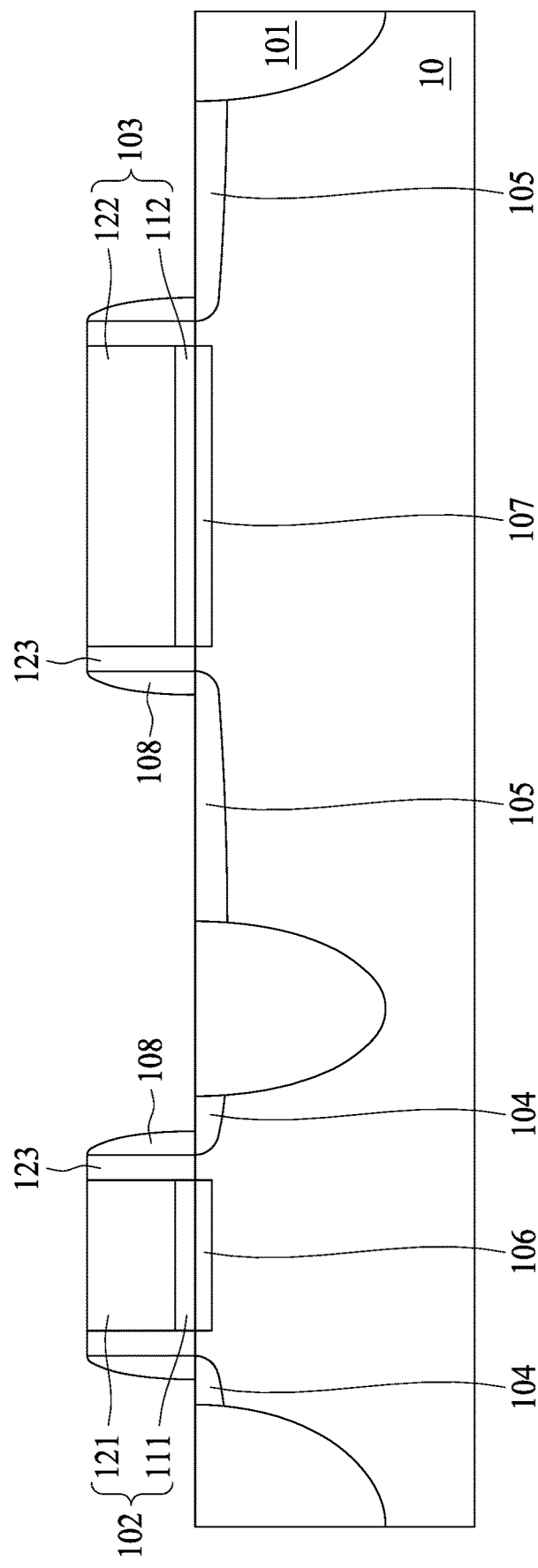

Referring to FIG. 3F dielectric spacers 108 may be formed adjacent each of the unmasked gate stacks 102 and 103. The dielectric spacers 108 may be formed by a variety of techniques above the lightly doped source/drain regions 104 and 105 and adjacent 20 the unmasked gate stacks 102 and 103. For example, the dielectric spacers 108 may be formed by depositing a conformal layer (not shown) of the appropriate material above and adjacent the unmasked gate stacks 102 and 103, and then performing an anisotropic reactive ion etching (RIE) process on the conformally blanket-deposited layer. The dielectric spacers 108 may each have a base thickness ranging from approximately 300-1500 Å, for example, measured from the edges of each of the unmasked gate stacks 102 and 103.

The dielectric spacers 108 may be formed from a variety of dielectric materials and may, for example, be an oxide (e.g., Ge oxide), a nitride (e.g., GaAs nitride), an oxynitride (e.g., GaP oxynitride), silicon dioxide (SiO$_2$), nitrogen-bearing SiO$_2$, silicon nitride (Si$_3$N$_4$), silicon oxynitride (Si$_x$O$_y$N$_z$), and the like. The dielectric spacers 108 may also be formed of any suitable "low dielectric constant" or "low K" material, where K is less than or equal to about 4. Examples include Applied Material's Black Diamond®, Novellus' Coral®, Allied Signal's Nanoglass®, JSR's LKD5104, and the like. The dielectric spacers 108 may be comprised of a fluorine-doped oxide, a fluorine-doped nitride, a fluorine-doped oxynitride, a fluorine-doped low K material, and the like. In one illustrative embodiment, the dielectric spacers 108 are comprised of SiO$_2$, having a base thickness of approximately 1500 Å.

Figure 3G:
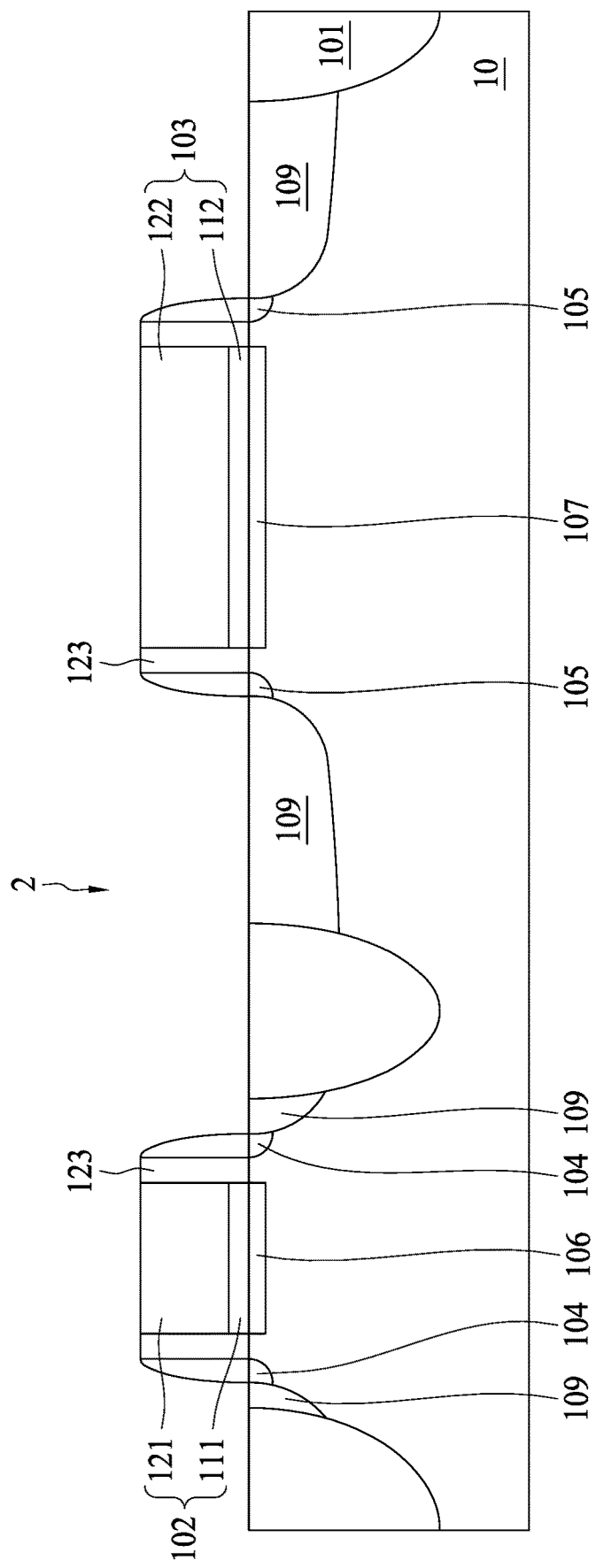

Referring to FIG. 3G, a dopant (not shown) may be implanted to introduce dopant atoms and/or molecules into the semiconductor substrate 10 to form N$^+$-doped (P$^+$-doped) regions 109. The N$^+$-doped (P$^+$-doped) regions 109 are formed in the semiconductor substrate 10 to form a semiconductor device 2. A dose of the dopant 1000 atoms and/or molecules may range from approximately $1.0 \times 10^{15}$-$5.0 \times 10^{15}$ ions/cm$^2$ of the appropriate dopant 1000 atoms and/or molecules, e.g., P for an illustrative NMOS transistor or B for an illustrative PMOS transistor. An implant energy of the dopant 1000 atoms and/or molecules may range from approximately 30-100 keV. In another illustrative embodiment, a dose of the dopant 1000 atoms is approximately $1.0 \times 10^{15}$ ions/cm$^2$ of P for an NMOS transistor or B for a PMOS transistor at an implant energy of approximately 30 keV.

Figure 4:
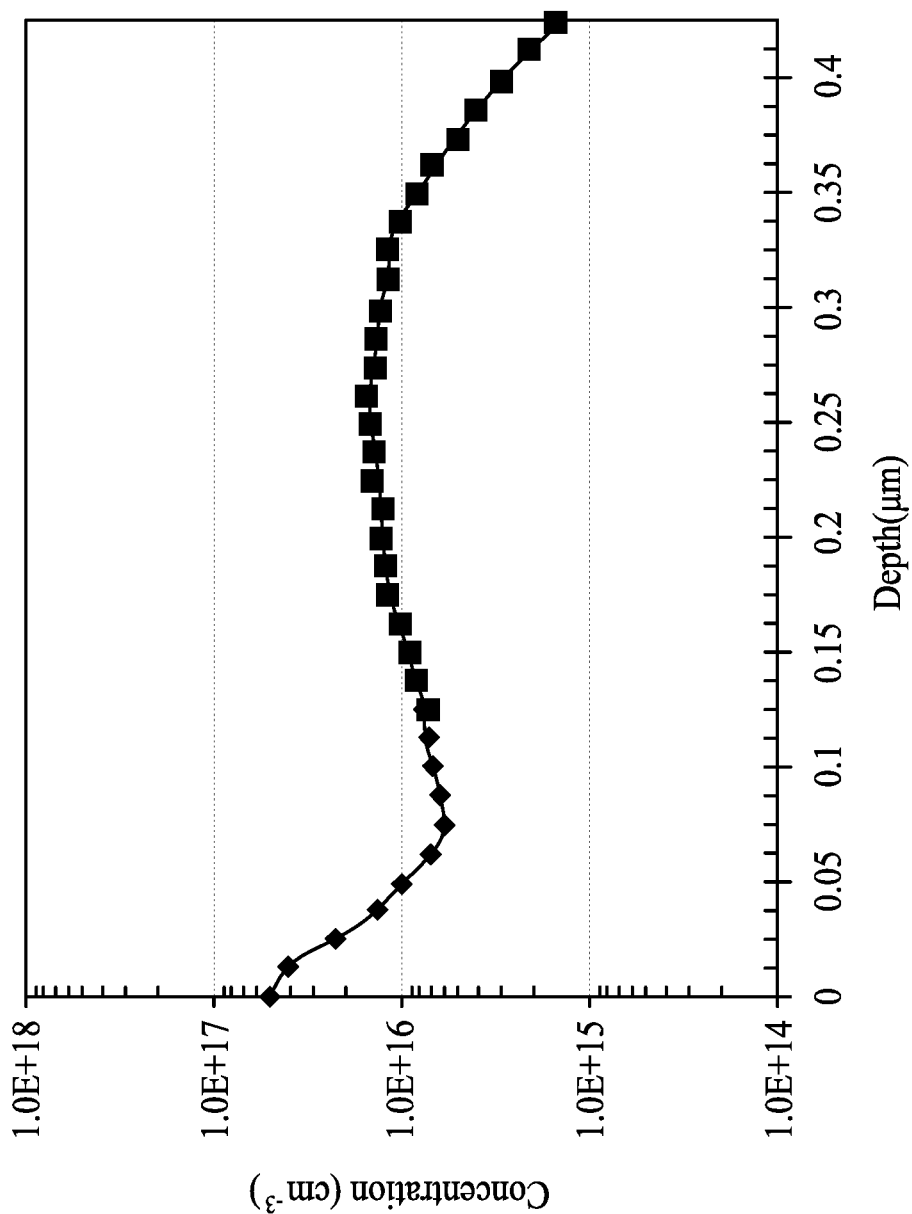
FIG. 4 is a graph illustrating a relationship between a doping concentration and a diffusion depth in a semiconductor substrate in accordance with some embodiments.

FIG. 4 is a graph illustrating a relationship between a doping concentration and a diffusion depth in a semiconductor substrate in accordance with some embodiments.

Referring to FIG. 4, concentration of at least one of the doped regions 106 and 107 of the semiconductor device 2 as illustrated and described with reference to FIG. 3G may range from $5 \times 10^{15}$ to $4 \times 10^{16}$ particles/cm$^3$. For example, the doped region 106 or the doped region 107 of the semiconductor device 2 may have a concentration of approximately $5 \times 10^{15}$ particles/cm$^3$ in the depth of approximately 0.075 µm beneath the upper surface $10u$ of the semiconductor substrate 10. For example, the doped region 106 or the doped region 107 of the semiconductor device 2 may have a concentration of approximately $4 \times 10^{16}$ particles/cm$^3$ beneath and near the upper surface $10u$ of the semiconductor substrate 10.

In accordance with some embodiments of the present disclosure, a semiconductor device includes a semiconductor substrate, and a first transistor. The first transistor has a first gate on the semiconductor substrate, and a first lightly doped source/drain region within the semiconductor substrate to determine a first channel region beneath the first gate. A doping ratio determined as a concentration of the first lightly doped source/drain region divided by a concentration of the first channel region ranges from $1.0 \times 10^{13}$ to $1.0 \times 10^{17}$.

In accordance with some embodiments of the present disclosure, a semiconductor device includes a semiconductor substrate, and a first transistor. The first transistor includes a first gate on the semiconductor substrate, a first tightly doped source/drain region within the semiconductor substrate, and a first channel region beneath the first gate. A concentration of the first channel region ranges from $4 \times 10^{14}$ to $2 \times 10^{15}$ particles/cm$^3$.

In accordance with some embodiments of the present disclosure, a semiconductor device includes a semiconductor substrate, a first transistor and a second transistor. The first transistor has a first gate on the semiconductor substrate, and a first lightly doped source/drain region within the semiconductor substrate to determine a first channel region beneath the first gate. The second transistor is adjacent to the first transistor. The second transistor has a second gate on the semiconductor substrate, and a second lightly doped source/drain region within the semiconductor substrate to determine a second channel region beneath the second gate. The first transistor and the second transistor are different in dimensions. A doping ratio determined as a concentration of the first lightly doped source drain region divided by a concentration of the first channel region ranges from $1.0 \times 10^{13}$ to $1.0 \times 10^{17}$.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
   a semiconductor substrate; and
   a first transistor having a first gate on the semiconductor substrate, and a first lightly doped source/drain region within the semiconductor substrate to determine a first channel region beneath the first gate;
   wherein a dopant is used to form the first lightly doped source/drain region and the first channel region, a concentration of the first channel region ranges from $4\times10^{14}$ particles/cm$^3$ to $2\times10^{15}$ particles/cm$^3$, the concentration of the first channel region is less than a concentration of the first lightly doped source/drain region, and a doping ratio determined as the concentration of the first lightly doped source/drain region divided by the concentration of the first channel region ranges from $1.0\times10^{13}$ to $1.0\times10^{17}$.

2. The semiconductor device of claim 1, wherein the concentration of the first channel region increases from an upper surface of the semiconductor substrate to a first depth along a depth direction, and decreases from the first depth to a second depth along the depth direction.

3. The semiconductor device of claim 2, wherein the first depth is substantially ranging from about 0.2 micrometers to about 0.3 micrometers.

4. The semiconductor device of claim 1, wherein the concentration of the first channel region beneath and near an upper surface of the semiconductor substrate is about $4\times10^{14}$ particles/cm$^3$.

5. The semiconductor device of claim 1, wherein the concentration of the first channel region at a depth of about 0.075 micrometers along a depth direction is about $2\times10$ particles/cm.

6. The semiconductor device of claim 1, wherein the dopant used to form the first lightly doped source/drain region has a dose ranging from $1.0\times10^{14}$ ions/cm$^2$ to $1.0\times10^{15}$ ions/cm$^2$, and the dopant used to form the first channel region is less than the dopant used to form the first lightly doped source/drain region from one to forty percent.

7. The semiconductor device of claim 1, further comprising a second transistor having a second gate on the semiconductor substrate, and a second lightly doped source/drain region within the semiconductor substrate to determine a second channel region beneath the second gate.

8. The semiconductor device of claim 7, wherein one of the first transistor and the second transistor includes a PMOS transistor, and the other one of the first transistor and the second transistor includes an NMOS transistor.

9. The semiconductor device of claim 8, wherein a dopant is used to form the second lightly doped source/drain region and the second channel region, a concentration of the second channel region ranges from $4\times10^{14}$ particles/cm$^3$ to $2\times10^{15}$ particles/cm$^3$, and the concentration of the second channel region is less than a concentration of the second lightly doped source/drain region, and a doping ratio determined as a concentration of the second lightly doped source/drain region divided by a concentration of the second channel region ranges from $1.0\times10^{13}$ to $1.0\times10^{17}$.

10. The semiconductor device of claim 9, wherein the dopant used to form the second lightly doped source/drain region has a dose ranging from $1.0\times10^{14}$ ions/cm$^2$ to $1.0\times10^{15}$ ions/cm$^2$, and the dopant used to form the second channel region is less than the dopant used to form the second lightly doped source/drain region from one to forty percent.

11. A semiconductor device, comprising:
    a semiconductor substrate;
    a first transistor having a first gate on the semiconductor substrate and a first lightly doped source/drain region within the semiconductor substrate to determine a first channel region beneath the first gate; and
    a second transistor adjacent to the first transistor, the second transistor having a second gate on the semiconductor substrate and a second lightly doped source/drain region within the semiconductor substrate to determine a second channel region beneath the second gate, wherein the first transistor and the second transistor are different in dimensions,
    wherein a first dopant is used to form the first lightly doped source/drain region and the first channel region, a concentration of the first channel region ranges from $4\times10^{14}$ particles/cm$^3$ to $2\times10^{15}$ particles/cm$^3$, the concentration of the first channel region is less than a concentration of the first lightly doped source/drain region, a doping ratio determined as the concentration of the first lightly doped source/drain region divided by the concentration of the first channel region ranges from $1.0\times10^{13}$ to $1.0\times10^{17}$, a second dopant is used to form the second lightly doped source/drain region and the second channel region, a concentration of the second channel region ranges from $4\times10^{14}$ particles/cm$^3$ to $2\times10^{15}$ particles/cm$^3$, and the concentration of the second channel region is less than a concentration of the second lightly doped source/drain region.

12. The semiconductor device of claim 11, wherein the concentration of the first channel region beneath and near an upper surface of the semiconductor substrate is about $4\times10^{14}$ particles/cm$^3$.

13. The semiconductor device of claim 11, wherein the concentration of the first channel region at a depth of about 0.075 micrometers along a depth direction is about $2\times10^{15}$ particles/cm$^3$.

14. A semiconductor device, comprising:
    a semiconductor substrate; and
    a first transistor having a first gate on the semiconductor substrate, and a first lightly doped source/drain region within the semiconductor substrate to determine a first channel region beneath the first gate;
    wherein a dopant is used to form the first lightly doped source/drain region and the first channel region, a concentration of the first channel region ranges from $4\times10^{14}$ particles/cm$^3$ to $2\times10^{15}$ particles/cm$^3$, the concentration of the first channel region is less than a concentration of the first lightly doped source/drain region, and the concentration of the first channel region increases from an upper surface of the semiconductor substrate to a first depth along a depth direction.

15. The semiconductor device of claim 14, wherein the concentration of the first channel region decreases from the first depth to a second depth along the depth direction.

16. The semiconductor device of claim 14, wherein the first depth is substantially range from about 0.2 micrometers to about 0.3 micrometers.

17. The semiconductor device of claim 14, further comprising a second transistor having a second gate on the semiconductor substrate, and a second lightly doped source/drain region within the semiconductor substrate to determine a second channel region beneath the second gate.

18. The semiconductor device of claim 17, wherein one of the first transistor and the second transistor includes a PMOS transistor, and the other one of the first transistor and the second transistor includes an NMOS transistor.

19. The semiconductor device of claim 17, wherein a dopant is used to form the second lightly doped source/drain region and the second channel region, a concentration of the second channel region ranges from $4 \times 10^{14}$ particles/cm$^3$ to $2 \times 10^{15}$ particles/cm$^3$, the concentration of the second channel region is less than a concentration of the second lightly doped source/drain region from one to forty percent, and a doping ratio determined as the concentration of the second lightly doped source/drain region divided by the concentration of the second channel region ranges from $1.0 \times 10^{13}$ to $1.0 \times 10^{17}$.

20. The semiconductor device of claim 14, wherein the dopant used to form the first lightly doped source/drain region has a dose ranging from $1.0 \times 10^{14}$ ions/cm$^2$ to $1.0 \times 10^{15}$ ions/cm$^2$, the dopant used to form the first channel region is less than the dopant used to form the first lightly doped source/drain region from one to forty percent.

* * * * *